(12) United States Patent
Chang et al.

(10) Patent No.: US 12,336,208 B2
(45) Date of Patent: Jun. 17, 2025

(54) MIDDLE VOLTAGE TRANSISTOR AND FABRICATING METHOD OF THE SAME

(71) Applicant: UNITED MICROELECTRONICS CORP., Hsin-Chu (TW)

(72) Inventors: Wei-Hsuan Chang, Tainan (TW); Hao-Ping Yan, Tainan (TW); Ming-Hua Tsai, Tainan (TW); Chin-Chia Kuo, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 559 days.

(21) Appl. No.: 17/694,694

(22) Filed: Mar. 15, 2022

(65) Prior Publication Data

US 2023/0261092 A1 Aug. 17, 2023

(30) Foreign Application Priority Data

Feb. 14, 2022 (CN) .......................... 202210132427.1

(51) Int. Cl.
*H10D 30/01* (2025.01)
*H01L 21/266* (2006.01)
(Continued)

(52) U.S. Cl.
CPC ....... *H10D 30/0227* (2025.01); *H01L 21/266* (2013.01); *H10D 30/601* (2025.01); *H10D 62/102* (2025.01)

(58) Field of Classification Search
CPC ............... H01L 29/665; H01L 29/6659; H01L 29/7848; H01L 29/4933; H01L 21/823418–823425; H01L 21/823814; H01L 21/823412; H01L 21/823807; H01L 29/0843–0891; H01L 29/66636–66643; H01L 29/66492; H01L 29/7833–7836; H01L 29/66575–66598; H01L 29/66515; H01L 29/1041–1045
See application file for complete search history.

(56) References Cited

U.S. PATENT DOCUMENTS 5,024,960 A 6/1991 Haken
5,698,884 A * 12/1997 Dennen .............. H10D 30/0223
257/E21.426
(Continued)

FOREIGN PATENT DOCUMENTS

KR 19920007074 4/1992

*Primary Examiner* — Maliheh Malek
(74) *Attorney, Agent, or Firm* — Winston Hsu

(57) ABSTRACT

A fabricating method of a middle voltage transistor includes providing a substrate. A gate predetermined region is defined on the substrate. Next, a mask layer is formed to cover only part of the gate predetermined region. Then, a first ion implantation process is performed to implant dopants into the substrate at two sides of the mask layer to form two first lightly doping regions. After removing the mask layer, a gate is formed to overlap the entirety gate predetermined region. Subsequently, two second lightly doping regions respectively formed within one of the first lightly doping regions. Next, two source/drain doping regions are respectively formed within one of the second lightly doping regions. Finally, two silicide layers are formed to respectively cover one of the source/drain doping regions.

7 Claims, 2 Drawing Sheets

(51) Int. Cl.
*H10D 30/60* (2025.01)
*H10D 62/10* (2025.01)

(56) References Cited

U.S. PATENT DOCUMENTS

| | | | | |
|---|---|---|---|---|
| 6,187,657 | B1* | 2/2001 | Xiang | H01L 21/28105 |
| | | | | 438/581 |
| 6,271,551 | B1* | 8/2001 | Schmitz | H10D 30/021 |
| | | | | 257/E21.409 |
| 6,362,054 | B1* | 3/2002 | Choi | H01L 21/266 |
| | | | | 438/266 |
| 6,492,216 | B1* | 12/2002 | Yeo | H10D 30/751 |
| | | | | 257/E29.268 |
| 6,657,223 | B1* | 12/2003 | Wang | H10D 64/021 |
| | | | | 257/E21.403 |
| 6,818,938 | B1* | 11/2004 | Naem | H10D 30/601 |
| | | | | 257/302 |
| 7,217,603 | B2* | 5/2007 | Currie | H01L 21/2807 |
| | | | | 438/149 |
| 7,342,284 | B2* | 3/2008 | Ting | H10D 84/0184 |
| | | | | 257/374 |
| 7,897,493 | B2* | 3/2011 | Fiorenza | H01L 21/26506 |
| | | | | 438/479 |
| 9,882,125 | B2 | 1/2018 | Toh | |
| 11,837,659 | B2* | 12/2023 | Chen | A61M 25/007 |
| 2002/0003273 | A1* | 1/2002 | Dawson | H10D 30/0227 |
| | | | | 257/E21.199 |
| 2004/0061191 | A1* | 4/2004 | Paton | H10D 30/6739 |
| | | | | 257/E21.409 |
| 2005/0035409 | A1* | 2/2005 | Ko | H01L 21/26513 |
| | | | | 257/E29.267 |
| 2008/0124864 | A1* | 5/2008 | Wang | H10D 30/0221 |
| | | | | 257/E21.654 |
| 2012/0061761 | A1* | 3/2012 | Makiyama | H10D 84/038 |
| | | | | 257/E21.632 |
| 2012/0098041 | A1* | 4/2012 | Verma | H10D 62/393 |
| | | | | 257/E21.409 |
| 2013/0029464 | A1* | 1/2013 | Flachowsky | H10D 30/0227 |
| | | | | 438/301 |
| 2013/0244388 | A1* | 9/2013 | Scheiper | H10D 62/307 |
| | | | | 257/E21.409 |
| 2014/0057405 | A1* | 2/2014 | Zhou | H10D 30/65 |
| | | | | 438/286 |
| 2015/0084064 | A1* | 3/2015 | Yamamoto | H10D 30/605 |
| | | | | 257/77 |
| 2015/0102405 | A1* | 4/2015 | Ryu | H10D 30/0281 |
| | | | | 438/286 |
| 2015/0140757 | A1* | 5/2015 | Kim | H10D 64/017 |
| | | | | 438/286 |
| 2015/0200270 | A1* | 7/2015 | Flachowsky | H01L 21/26586 |
| | | | | 257/338 |
| 2016/0211181 | A1* | 7/2016 | Saha | H10D 62/371 |
| 2016/0233333 | A1* | 8/2016 | Toh | H10N 50/01 |
| 2018/0122897 | A1* | 5/2018 | He | H10D 30/797 |
| 2018/0190816 | A1* | 7/2018 | Siddiqui | H10D 30/603 |
| 2019/0157421 | A1* | 5/2019 | Wang | H10D 30/796 |
| 2020/0020801 | A1* | 1/2020 | Ryu | H10D 62/159 |
| 2020/0194588 | A1* | 6/2020 | Lee | H10N 70/253 |
| 2022/0115536 | A1* | 4/2022 | Chen | A61M 25/003 |
| 2022/0199803 | A1* | 6/2022 | Han | H10D 64/663 |
| 2022/0376071 | A1* | 11/2022 | Tsai | H10D 30/0227 |
| 2022/0384646 | A1* | 12/2022 | Chen | H10D 62/151 |
| 2022/0406935 | A1* | 12/2022 | Woo | H10D 30/6717 |
| 2023/0023179 | A1* | 1/2023 | Ji | H10D 64/671 |
| 2023/0042167 | A1* | 2/2023 | Saha | H10D 84/0147 |
| 2023/0197843 | A1* | 6/2023 | Yang | H10D 30/6755 |
| | | | | 257/288 |
| 2023/0231051 | A1* | 7/2023 | Hsu | H10D 30/797 |
| | | | | 257/190 |
| 2023/0307524 | A1* | 9/2023 | Wu | H10D 30/028 |

* cited by examiner

MIDDLE VOLTAGE TRANSISTOR AND FABRICATING METHOD OF THE SAME

BACKGROUND OF THE INVENTION

1. Field of the Invention

The present invention relates to a middle voltage transistor which having two lightly doping regions surrounding one source/drain doping region and method of fabricating the same.

2. Description of the Prior Art

Semiconductor devices are used in a variety of electronic applications such as personal computers, cell phones, digital cameras, and other electronic equipment. The fabricating method of a semiconductor device usually includes sequentially deposit materials of insulators, conductive layers, and semiconductor layers on a semiconductor substrate. Later, materials are patterned to by lithographic processes to form circuit elements on the semiconductor substrate.

As the integration of semiconductor elements increases, more elements can be integrated into a given area. However, as the feature size shrinks, additional problems arise in each process. For example, when the dielectric layer is removed, the gate dielectric layer is also etched. The etching of the gate dielectric layer leads to current leakage of the transistor completed afterwards.

SUMMARY OF THE INVENTION

In view of this, the present invention provides a new transistor structure and process so as to prevent current leakage.

According to a preferred embodiment of the present invention, a middle voltage transistor includes a substrate. A gate is disposed on the substrate. A gate dielectric layer is disposed between the substrate and the gate. A first lightly doping region is embedded in the substrate and extends to be under the gate. A second lightly doping region is embedded within the first lightly doping region, and the first lightly doping region surrounds the second lightly doping region, wherein the second lightly doping region includes a first edge. A source/drain doping region is embedded within the second lightly doping region, and the second lightly doping region surrounds the source/drain doping region, wherein the source/drain doping region includes a second edge. A silicide layer covers and contacts the source/drain doping region, wherein the silicide layer includes an end, and the end is disposed between the first edge and the second edge.

According to a preferred embodiment of the present invention, a fabricating method of a middle voltage transistor includes providing a substrate. A gate predetermined region is defined on the substrate. Later, a mask layer is formed to cover only part of the gate predetermined region. Subsequently, a first ion implantation process is performed by taking the mask layer as a first mask to implant dopants into the substrate at two sides of the mask layer to form two first lightly doping regions. After removing the mask layer, a gate is formed to overlap an entirety of the gate predetermined region. Next, two second lightly doping regions are respectively formed within one of the two first lightly doping regions. After that, two source/drain doping regions are respectively formed within one of the two second lightly doping regions. Finally, two silicide layers are formed to respectively cover one of the two source/drain doping regions.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 4 depict a fabricating method of a middle voltage transistor according to a preferred embodiment of the present invention, wherein:

FIG. 1 depicts a substrate having two lightly doping regions thereon;
FIG. 2 continues from FIG. 1;
FIG. 3 continues from FIG. 2; and
FIG. 4 continues from FIG. 3.

DETAILED DESCRIPTION

Figure 1:
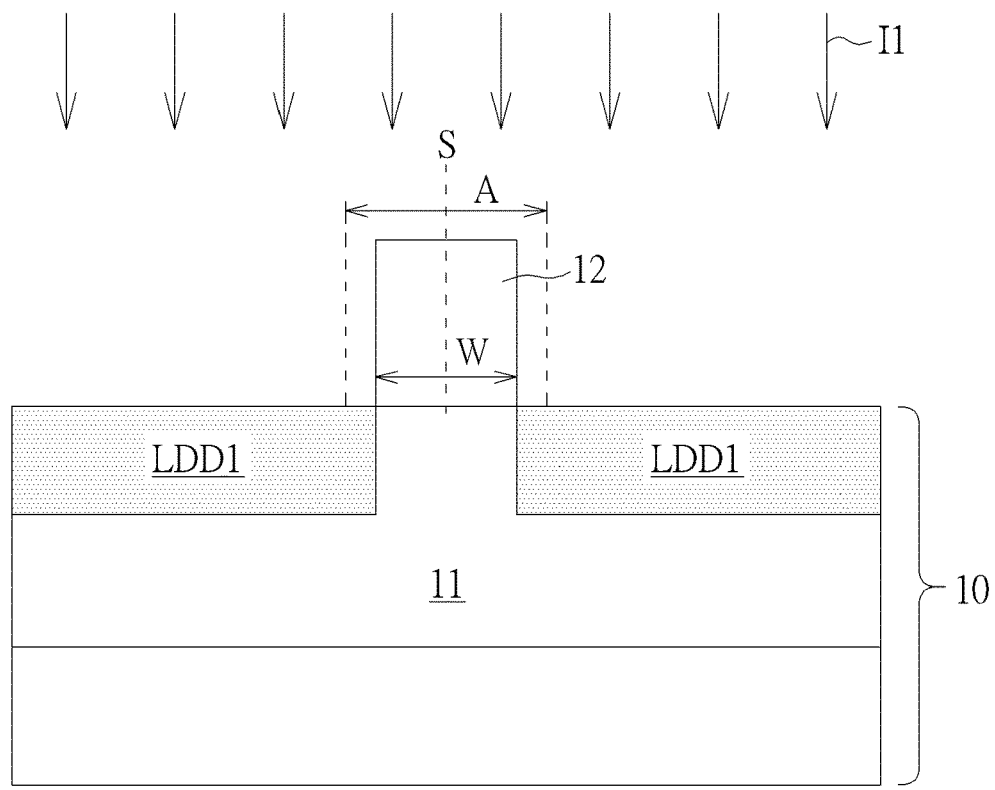

FIG. 1 to FIG. 4 depict a fabricating method of a middle voltage transistor according to a preferred embodiment of the present invention. As shown in FIG. 1, a substrate 10 is provided. A gate predetermined region A is defined on the substrate 10. Later, a doping well 11 is formed within the substrate 10. Subsequently, a mask layer 12 is formed to cover only part of the gate predetermined region A. The mask layer 12 may be photo resist, silicon nitride silicon oxynitride or other materials. In details, the gate predetermined region A has a symmetrical axis S. A symmetrical axis of the mask layer 12 overlaps the symmetrical axis S of the gate predetermined region A. That is, the mask layer 12 is in the middle of the gate predetermined region A. A width W of the mask layer 12 is smaller than the gate predetermined region A. Next, a first ion implantation process 11 is performed by taking the mask layer 12 as a mask to implant dopants into the substrate 10 at two sides of the mask layer 12 to form two first lightly doping regions LDD1.

Figure 2:
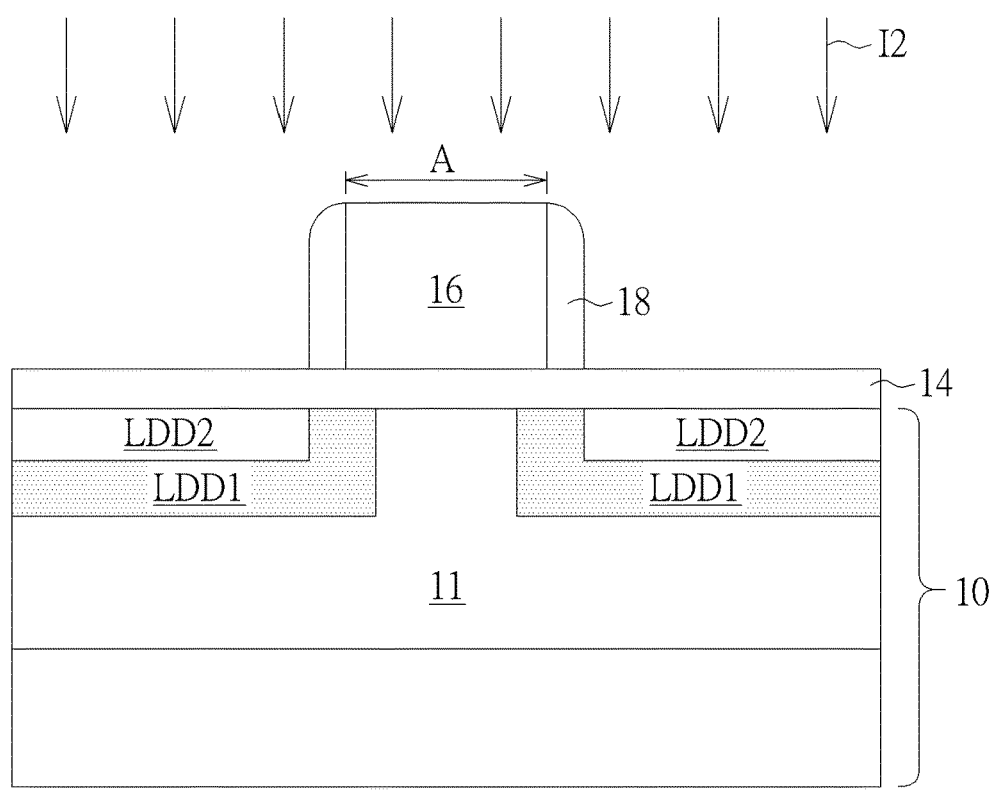

As shown in FIG. 2, after the mask layer 12 is removed. A gate dielectric layer 14 is formed to blanketly cover the substrate 10. Next, a gate 16 is formed on the gate dielectric layer 14, and the gate 16 covers the entirety of the gate predetermined region A. Now, part of each of the first lightly doping regions LDD1 is directly under the gate 16. In other words, part of each of the first lightly doping regions LDD1 overlaps the gate 16. It is noteworthy that because the positions of the first light doped regions LDD1 are defined by the mask layer 12, the overlapping region between the gate 16 and the first lightly doping regions LDD1 can be altered by adjusting the width W of the mask layer 12. Next, two first spacers 18 are formed at two side of the gate 16. Later, a second ion implantation process 12 is performed by taking the first spacers 18 and the gate 16 as a mask to implant dopants to penetrate the gate dielectric layer 14 to form the second lightly doping regions LDD2 in the substrate 10. The second lightly doping regions LDD2 are disposed at two side of the gate 16. One of the second lightly doping regions LDD2 is within one of the first lightly doping regions LDD1. The other one of the second lightly doping regions LDD2 is within the other one of the first lightly doping regions LDD1. The first lightly doping region LDD1 surrounds the second lightly doping region LDD2 disposed therein. Each of the first lightly doping regions LDD1 has a range greater than each of the second lightly doping regions LDD2.

Figure 3:
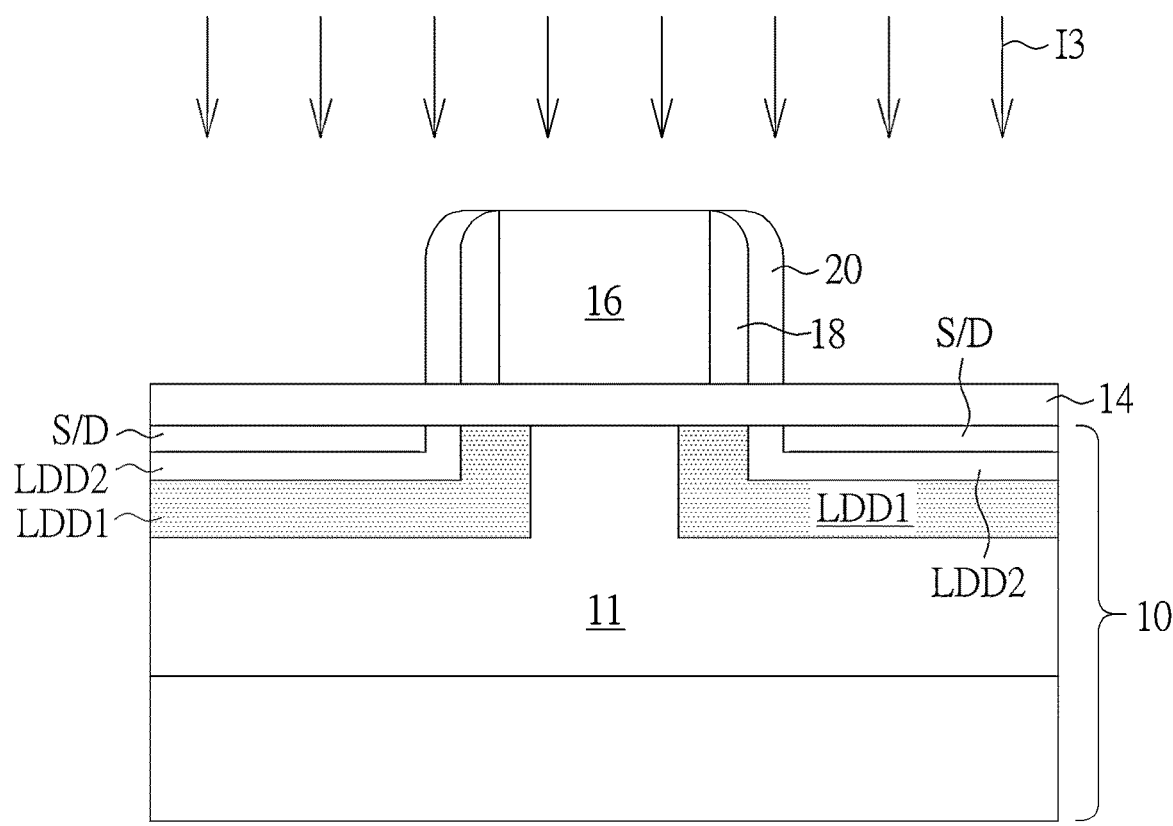

As shown in FIG. 3, two second spacers 20 are respectively formed on one of the first spacers 18. Next, a third ion implantation process 13 is performed by taking the gate 16, the first spacers 18 and the second spacers 20 as a mask to implant dopants to penetrate the gate dielectric layer 14 to form two source/drain doping regions S/D in the substrate 10. The source/drain doping regions S/D are at two sides of the gate 16. The source/drain doping regions S/D are respectively embedded within one of the second lightly doping regions LDD2. Moreover, the second lightly doping region LDD2 surrounds the source/drain doping region S/D embedded therein.

Figure 4:
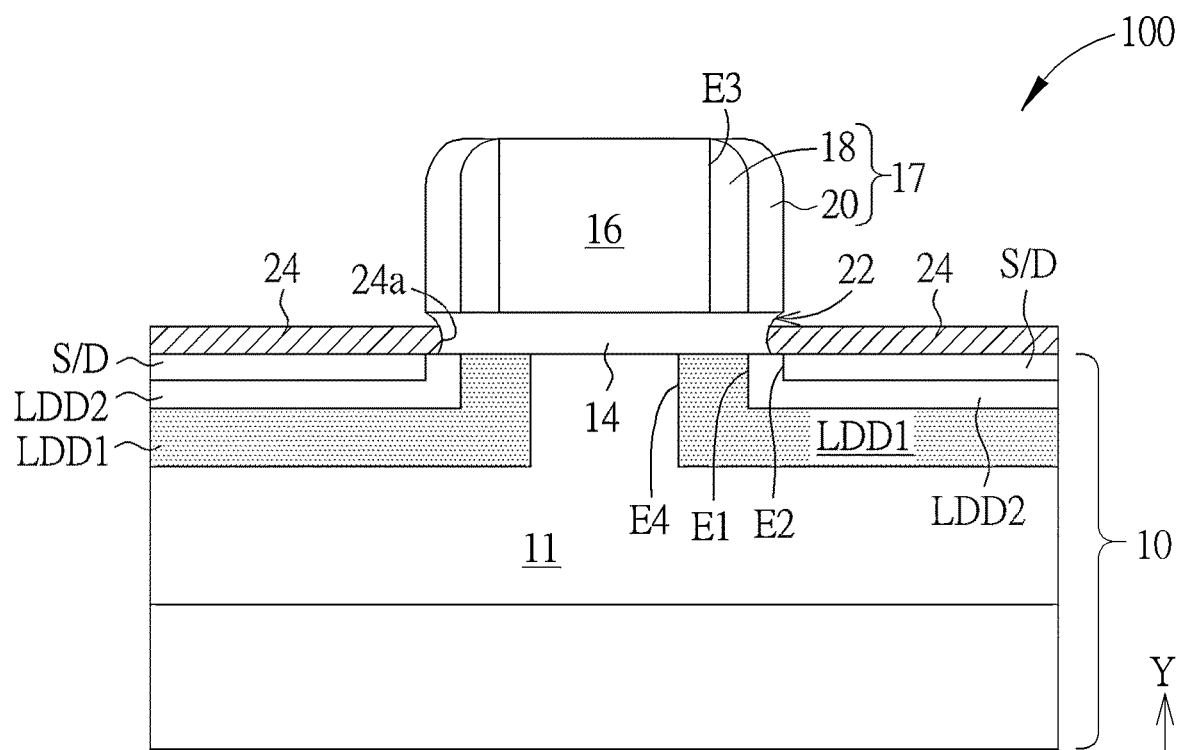

As shown in FIG. 4, the gate dielectric layer 14 directly on the source/drain doping regions S/D is removed to expose the source/drain doping regions S/D. That is, the part of the gate dielectric layer 14 which is not covered by the gate 16, the first spacers 18 and the second spacers 20 is removed. When the gate dielectric layer 14 directly on the source/drain doping regions S/D is removed, part of the gate dielectric layer 14 under the second spacers 20 is removed uncontrolledly. Therefore, a recess 22 is formed in the gate dielectric layer 14 under the second spacers 20. This recess 22 can even extend to be under the first spacers 18 sometimes. Later, a silicide process is performed to form two silicide layers 24 respectively cover and contact one of the source/drain doping regions S/D. The silicide layers 24 are not only formed directly on the source/drain doping regions S/D, but also fills into the recess 22. That is, the silicide layers 24 will exceed the region directly on the source/drain doping regions S/D. Now, the middle voltage transistor 100 of the present invention is completed. The fabricating process of the middle voltage transistor 100 is suitable for manufacturing N-type transistors and P-type transistors.

FIG. 4 depicts a middle voltage transistor formed by the fabricating method provided in the present invention. The middle voltage transistor 100 of the present invention can be an N-type transistor or a P-type transistor. The middle voltage transistor 100 includes a substrate 10. A first direction Y is perpendicular to a top surface of the substrate 10 and a second direction X is parallel to the top surface of the substrate 10. A gate 16 is disposed on the substrate 10. A gate dielectric layer 14 is disposed between the substrate 10 and the gate 16. A first lightly doping region LDD1 is embedded in the substrate 10 and extends to be under the gate 16. A second lightly doping region LDD2 is embedded within the first lightly doping region LDD1, and the first lightly doping region LDD1 surrounds the second lightly doping region LDD2. The second lightly doping region LDD2 includes a first edge E1. A source/drain doping region S/D is embedded within the second lightly doping region LDD2, and the second lightly doping region LDD2 surrounds the source/drain doping region S/D, wherein the source/drain doping region S/D includes a second edge E2. The first edge E1 and the second edge E2 are both parallel to the first direction Y.

A silicide layer 24 covers and contacts the source/drain doping region S/D, wherein the silicide layer 24 includes an end 24a and the end 24a is disposed between the first edge E1 and the second edge E2. The end 24a of the silicide layer 24 contacts the gate dielectric layer 14. Moreover, two composite spacers 17 contact the gate 16 and the composite spacers 17 are respectively disposed at two sides of the gate 16. Each of the composite spacers 17 includes a first spacer 18 and a second spacer 20. The first spacer 18 contacts the gate 16 and is disposed at one side of the gate 16. The other first spacer 16 also contacts the gate 16 and at the other side of the gate 16. The second spacer 20 contacts one of the first spacers 16. The other second spacer 20 contacts the other first spacer 16 which is at the other side of the gate 16. The first spacers 18 and the second spacers 20 are all entirely disposed at a top surface of the gate dielectric layer 14, and a width of the gate dielectric layer 14 is greater than a width of the gate 16. The width of the gate dielectric layer 14 and the width of the gate 16 are both parallel to the second direction X. The second direction X is not only parallel to the top surface of the substrate 10, but also extends from one source/drain doping region S/D to the other source/drain doping region S/D. The width of the gate dielectric layer 14 equals to the summation of the width of the gate 16, the width of the two first spacers 18 and the width of the two second spacers 20.

Furthermore, the gate 16 includes a third edge E3 parallel to the first direction Y, the first lightly doping region LDD1 includes a fourth edge E4 parallel to the first direction Y. According to a preferred embodiment of the present invention, along the second direction X, a distance between the third edge E3 and the fourth edge E4 is smaller than half of the width of the gate 16. Moreover, the operational voltage of the middle voltage transistor 100 can be operated at a normal operational voltage or an under drive voltage. For example, the operational voltage of the middle voltage transistor 100 can be between 1.8 and 9 volts. The thickness of the gate dielectric layer 14 is preferably between 100 and 250 angstroms.

The first lightly doping region LDD1 has a first dopant concentration, the second lightly doping region LDD2 has a second dopant concentration, the source/drain doping region S/D has a third dopant concentration. The third dopant concentration is greater than the second dopant concentration, and the second dopant concentration is greater than the first dopant concentration. For example, the first dopant concentration is between 1E17 and 5E18 $cm^{-3}$, the second dopant concentration is between 5E18 and 9E18 $cm^{-3}$, and the third dopant concentration is between 5E18 and 9E20 $cm^{-3}$. The source/drain doping region S/D of the present invention is surrounded by two lightly doping regions (the first lightly doping region LDD1 and the second lightly doping region LDD2). The depth of the first lightly doping region LDD1 is greater than the depth of the second lightly doping region LDD2. The depth of the second lightly doping region LDD2 is greater than the depth of the source/drain doping region S/D. On the contrary, in a conventional transistor, the depth of the lightly doping region is smaller than the depth of the source/drain doping region S/D.

According to the fabricating process of the middle voltage transistor 100 mentioned above, the silicide layer 24 is not only formed directly on the source/drain doping regions S/D, but also fills into the recess 22 to make the end 24a of the silicide layer 24 to extend to be under the second spacer 20. If there is no second lightly doping region LDD2, the difference between the dopant concentration of the source/drain doping region S/D and the dopant concentration of the first lightly doping region LDD1 will be too large, and electrons will punch through at the recess 22, and then current leakage occurs. Therefore, the second lightly doping region LDD2 which having a dopant concentration between the dopant concentration of the source/drain doping region S/D and the dopant concentration of the first lightly doping region LDD1 is specially provided in the present invention. Moreover, the end 24a of the silicide layer 24 is in a position which does not exceed the first edge E1 of the second lightly doping region LDD2. In this way, current leakage can be effectively prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A middle voltage transistor, comprising: a substrate; a gate disposed on the substrate; a gate dielectric layer disposed between the substrate and the gate and a width of the gate dielectric layer is greater than a width of the gate; a composite spacer contacting the gate and disposed at one side of the gate, wherein the composite spacer comprises: a first spacer contacting the gate and disposed at one side of the gate; and a second spacer contacting the first spacer, wherein the first spacer and the second spacer are entirely disposed at a top surface of the gate dielectric layer; a first lightly doping region embedded in the substrate and extending to be under the gate; a second lightly doping region embedded within the first lightly doping region, and the first lightly doping region surrounding the second lightly doping region, wherein the second lightly doping region comprises a first edge, and the first edge is disposed directly under the composite spacer; a source/drain doping region embedded within the second lightly doping region, and the second lightly doping region surrounding the source/drain doping region, wherein the source/drain doping region comprises a second edge; and a silicide layer covering and contacting the source/drain doping region, wherein the silicide layer comprises an end, and the end is disposed between the first edge and the second edge contacting the gate dielectric layer.

2. The middle voltage transistor of claim 1, wherein a first direction is perpendicular to a top surface the substrate, and the first edge and the second edge are both parallel to the first direction.

3. The middle voltage transistor of claim 1, wherein a first direction is perpendicular to a top surface of the substrate, a second direction is parallel to the top surface of the substrate, the gate comprises a third edge parallel to the first direction, the first lightly doping region comprises a fourth edge parallel to the first direction, and wherein along the second direction, a distance between the third edge and the fourth edge is smaller than half of the width of the gate.

4. The middle voltage transistor of claim 1, wherein a thickness of the gate dielectric layer is between 100 and 250 angstroms.

5. The middle voltage transistor of claim 1, wherein an operational voltage of the middle voltage transistor is between 1.8 and 9 volts.

6. The middle voltage transistor of claim 1, wherein the first lightly doping region has a first dopant concentration, the second lightly doping region has a second dopant concentration, the source/drain doping region has a third dopant concentration, the third dopant concentration is greater than the second dopant concentration, and the second dopant concentration is greater than the first dopant concentration.

7. The middle voltage transistor of claim 6, wherein the first dopant concentration is between 1E17 and 5E18 $cm^{-3}$, the second dopant concentration is between 5E18 and 9E18 $cm^{-3}$, and the third dopant concentration is between 5E18 and 9E20 $cm^{-3}$.

* * * * *